(12) United States Patent
Hibi et al.

(10) Patent No.: US 6,730,973 B2
(45) Date of Patent: May 4, 2004

(54) SEMICONDUCTOR DEVICE

(75) Inventors: Yasuhiro Hibi, Hyogo (JP); Tsuyoshi Sugihara, Hyogo (JP); Satoshi Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/319,533

(22) Filed: Dec. 16, 2002

(65) Prior Publication Data
US 2003/0227042 A1 Dec. 11, 2003

(30) Foreign Application Priority Data
Jun. 11, 2002 (JP) ........................................ 2002-169605

(51) Int. Cl.[7] ........................... H01L 29/94; H01L 29/76
(52) U.S. Cl. ...................... 257/390; 257/391; 257/314; 257/315; 257/316; 257/338; 257/369
(58) Field of Search ................................. 257/390, 391, 257/314, 315, 316, 320, 321, 324, 211, 296, 338, 369, 208, 209

(56) References Cited

U.S. PATENT DOCUMENTS 6,362,049 B1 * 3/2002 Cagnina et al. ............. 438/258

2002/0117708 A1 * 8/2002 Nishioka ..................... 257/314

FOREIGN PATENT DOCUMENTS

JP        P2000-216353 A    8/2000

* cited by examiner

*Primary Examiner*—Minhloan Tran
*Assistant Examiner*—Tan Tran
(74) *Attorney, Agent, or Firm*—McDermott, Will & Emery

(57) ABSTRACT

A first pattern forming a memory cell is provided on a memory cell region, and a second pattern consisting of a film containing nitrogen atoms is provided on the first pattern. A third pattern forming a gate electrode of a transistor so that the height between the main surface of a semiconductor substrate and the surface of the third pattern is lower than the first pattern is provided on a peripheral circuit region, and a fourth pattern consisting of a film containing nitrogen atoms having a larger thickness than the second pattern is provided on the third pattern in correspondence to the third pattern. The thickness of a portion of the interlayer dielectric film located between the second pattern and a second conductive layer is smaller than the thickness of a portion of the interlayer dielectric film located between the fourth pattern and the second conductive layer.

7 Claims, 12 Drawing Sheets

PERIPHERAL CIRCUIT REGION    MEMORY CELL REGION

SEMICONDUCTOR DEVICE

BACKGROUND OF THE INVENTION

1. Field of the Invention

The present invention generally relates to a semiconductor device, and more specifically, it relates to a semiconductor device reducing a surface step of an interlayer dielectric film.

2. Description of the Background Art

FIG. 13 is a plan view of a conventional flash memory.

Peripheral transistors are provided around memory cells. Dummy gates are provided between the peripheral transistors and the memory cells. A plurality of interlayer dielectric films are provided on these semiconductor devices.

A method of fabricating the conventional flash memory is now described with reference to FIGS. 14 to 23 illustrating a peripheral circuit region and a memory cell region of the flash memory.

Referring to FIG. 14, shallow trench isolation films (STI) 2 are provided on the surface of a silicon substrate 1.

Referring to FIG. 15, a tunnel oxide film 3 is provided on the silicon substrate 1. A first gate electrode 4 of polysilicon is formed on the tunnel oxide film 3. The first gate electrode 4 is employed for forming floating gate electrodes.

Referring to FIG. 16, an ONO (Oxide-Nitride-Oxide Multilayers) film 5, formed by an oxide film, a nitride film and an oxide film, is provided on the silicon substrate 1 to cover the surface of the first gate electrode 4.

Referring to FIGS. 16 and 17, portions of the tunnel oxide film 3, the first gate electrode 4 and the ONO film 5 located on the peripheral circuit region are removed.

Referring to FIG. 18, a gate oxide film 6 is formed on the peripheral circuit region. Thereafter polysilicon layers 7, WSi layers 8 and TEOS (Tetra Ethyl Ortho Silicate) films 9 are successively formed on the silicon substrate 1 including the peripheral circuit region and the memory cell region.

FIG. 19 is a sectional view taken along the line XIX—XIX in FIG. 18. FIGS. 20 to 23 are sectional views also taken along the line XIX—XIX in FIG. 18. Referring to FIG. 19, the polysilicon layers 7 and the WSi layers 8 are generically referred to as control gate electrodes.

Referring to FIG. 20, the first gate electrode 4 is patterned for forming floating gate electrodes 4.

Referring to FIG. 21, side wall spacers 10 are formed on the side walls of the control gate electrode in the peripheral circuit region and those of memory cells. Then, a source line 16 is formed by etching. At this time, the TEOS films 9 are also partially scraped. A first interlayer dielectric film 11 is formed on the silicon substrate 1, to cover the control gate electrode and the memory cells.

Referring to FIG. 22, the first interlayer dielectric film 11 is polished up to an intermediate stage by chemical mechanical polishing (CMP), for flattening a surface step of the first interlayer dielectric film 11.

Referring to FIG. 23, contact holes 12 are formed in the first interlayer dielectric film 11. W is embedded in the contact holes 12 for forming plugs 20 followed by formation of Al wires 13 patterned to extend in the horizontal direction, thereby completing the flash memory.

In the conventional method, the surface step of the first interlayer dielectric film 11 is flattened through the process of stopping etching the interlayer dielectric film 11 in the intermediate stage of CMP.

However, the thickness of the interlayer dielectric film 11 is remarkably dispersed in the chip due to a step caused by a gate electrode or the like located under the interlayer dielectric film 11.

Further, the CMP process stopping etching in the intermediate stage disadvantageously results in remarkable dispersion between lots.

In another conventional method, therefore, dummy STI films 21 and a dummy gate electrode 22 are formed in order to suppress dispersion of a surface step in flattening of an interlayer dielectric film by CMP, as shown in FIGS. 24 and 25. Referring to FIGS. 24 and 25, numeral 30 denotes a gate electrode of a transistor.

FIG. 25 is a plan view, and FIG. 24 is a sectional view taken along the line XXIV—XXIV in FIG. 25.

While this method is carried out in order to homogeneously eliminate dispersion of a step located under the interlayer dielectric film, CMP is stopped in an intermediate stage, to disadvantageously result in dispersion of the surface step of the interlayer dielectric film.

SUMMARY OF THE INVENTION

The present invention has been proposed in order to solve the aforementioned problems, and an object thereof is to provide a semiconductor device so improved as to cause no dispersion in a surface step of an interlayer dielectric film.

Another object of the present invention is to provide a flash memory so improved as to cause no dispersion in a surface step of an interlayer dielectric film.

The semiconductor device according to the present invention comprises a memory cell region having a memory cell and a peripheral circuit region having a transistor, both provided on a semiconductor substrate, a first pattern consisting of a first conductive layer forming the aforementioned memory cell, a second pattern consisting of a film, containing nitrogen atoms, provided on the aforementioned first pattern in correspondence to the first pattern, a third pattern forming a gate electrode of the aforementioned transistor so that the height between the main surface of the aforementioned semiconductor substrate and the surface of the third pattern is lower than the aforementioned first pattern, and a fourth pattern consisting of a film, containing nitrogen atoms, provided on the aforementioned gate electrode in correspondence to the aforementioned third pattern with a larger thickness than the aforementioned second pattern. A second conductive layer is formed on the aforementioned second and fourth patterns. The thickness of a portion of an interlayer dielectric film located between the aforementioned second pattern and the aforementioned second conductive layer is smaller than the thickness of a portion of the interlayer dielectric film located between the aforementioned fourth pattern and the aforementioned second conductive layer.

According to the present invention, the thickness of the second pattern formed on the first pattern is smaller than the thickness of the fourth pattern and the thickness of the interlayer dielectric film is also small although the height of the third pattern between the main surface of the semiconductor substrate and the surface of the pattern is lower than the first pattern, whereby the second conductive layer is improved in step of a wire between the memory cell region and the peripheral circuit region to attain excellent flatness and high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 12.
First Embodiment Referring to FIG. 1, shallow trench isolation (STI) films 2 are provided on the surface of a silicon substrate 1, in order to fabricate a semiconductor device according to a first embodiment of the present invention.

Figure 1:
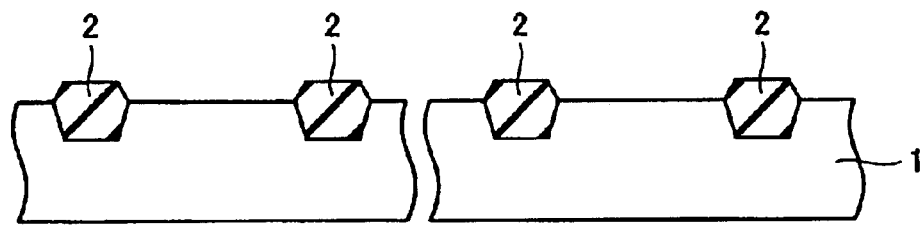
FIGS. 1 to 5 are sectional views showing first to fifth steps of a method of fabricating a semiconductor device according to a first embodiment of the present invention.
Figure 2:
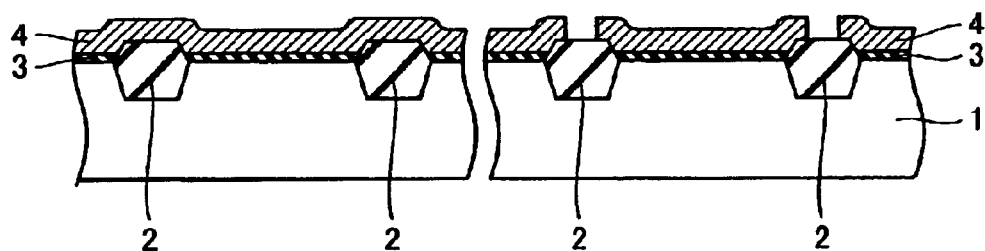

Referring to FIG. 2, a tunnel oxide film 3 is formed on the silicon substrate 1. A first gate electrode 4 of polysilicon is provided on the tunnel oxide film 3. The first gate electrode 4 is employed for forming floating gate electrodes.

Figure 3:
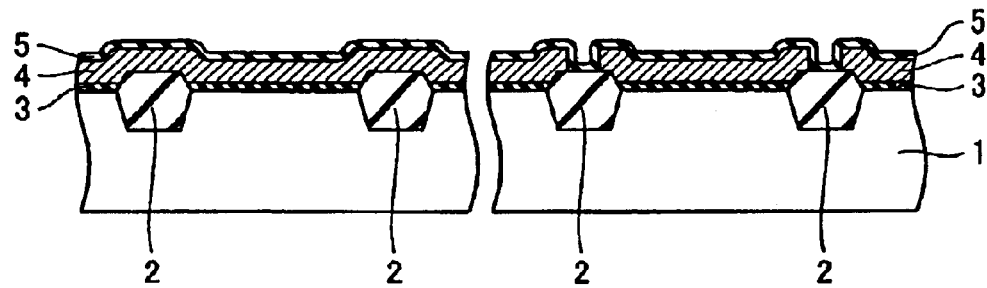

Referring to FIG. 3, an ONO film 5, formed by an oxide film, a nitride film and an oxide film, is provided on the silicon substrate 1 to cover the surface of the first gate electrode 4.

Figure 4:
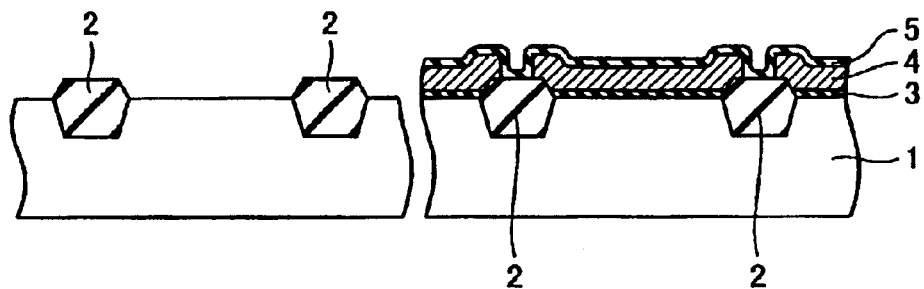

Referring to FIGS. 3 and 4, portions of the tunnel oxide film 3, the first gate electrode 4 and the ONO film 5 located on a peripheral circuit region are removed.

Figure 5:
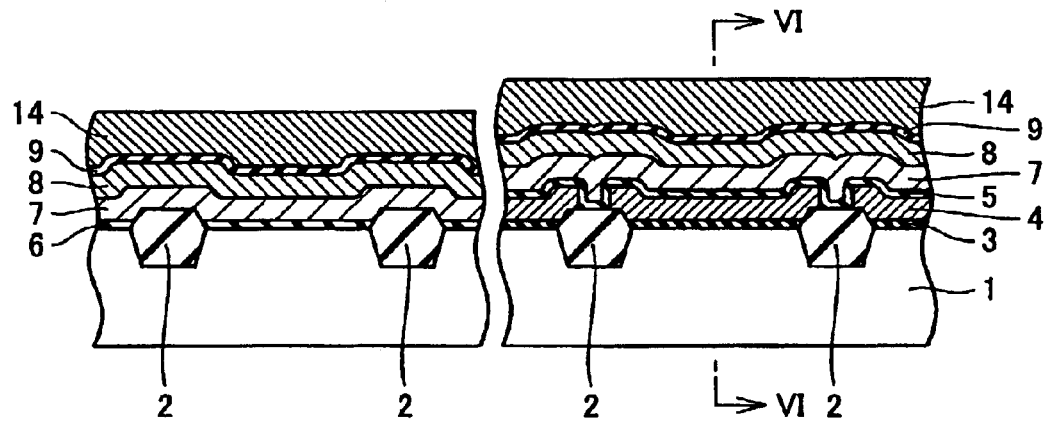

Referring to FIG. 5, polysilicon layers 7, WSi layers 8 and TEOS films 9 are formed on the silicon substrate 1, followed by formation of silicon nitride films 14. In this specification, a pattern formed by the multilayer structure of the polysilicon layers 7 and the WSi layers 8 may be referred to as a first pattern or a third pattern. The polysilicon layers 7 and the WSi layers 8 are employed for forming control gate electrodes.

Figure 6:
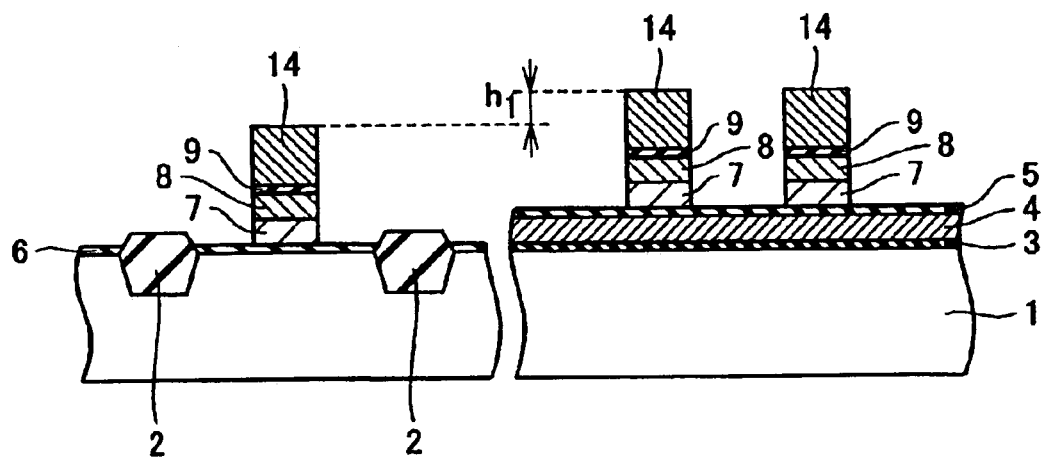
FIG. 6 is a sectional view of the semiconductor device according to the first embodiment taken along the line VI—VI in FIG. 5.

FIG. 6 is a sectional view taken along the line VI—VI in FIG. 5.

Figure 7:
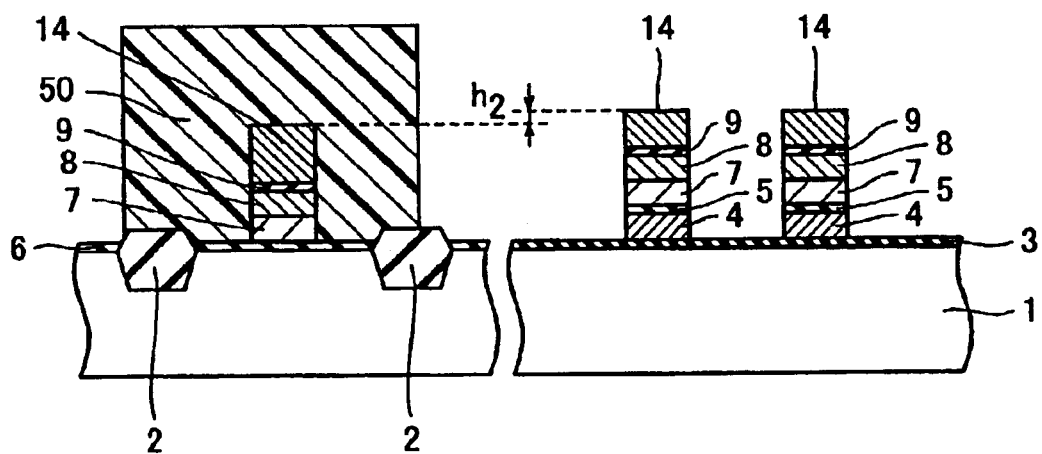
FIGS. 7 to 10 are sectional views showing sixth to ninth steps of the method of fabricating the semiconductor device according to the first embodiment of the present invention.

The thickness of the first gate electrode 4 defines the difference $h_1$ between the heights of the silicon nitride films 14 formed on the peripheral circuit region and a memory cell region respectively. It has been found that this difference $h_1$ can be reduced through a step shown in FIG. 7 as follows:

Referring to FIG. 7, the peripheral circuit region is covered with a resist film 50 for etching the ONO film 5 and the first gate electrode 4. The etching rates for the ONO film 5 and the silicon nitride films 14 are substantially identical to each other. When the ONO film 5 is etched, therefore, the surfaces of the silicon nitride films 14 are also etched substantially at the same degree. However, the thickness of the silicon nitride film 14 located on the peripheral circuit region remains unchanged due to the resist film 50 covering the same, to result in smaller difference $h_2$ between the heights of the silicon nitride films 14 than the aforementioned difference $h_1$. Thereafter the resist film 50 is removed.

In order to reduce the difference $h_1$ between the heights of the silicon nitride films 14 formed on the peripheral circuit region and the memory cell region respectively, the thickness (T (silicon nitride film)) of the silicon nitride film 14 formed on the peripheral circuit region is preferably selected to satisfy the following inequality, assuming that T (floating gate electrode) represents the thickness of the first gate electrode 4, T (polysilicon layer) represents the thickness of the polysilicon layers 7 and T (WSi layer) represents the thickness of the WSi layers 8 respectively:

T (WSi layer)+T (polysilicon layer)+T (floating gate electrode)$\geq$T (silicon nitride film)$\geq$T (floating gate electrode)

The thickness T (silicon nitride film) is set greater than or equal to the thickness T (floating gate electrode) (T (silicon nitride film)$\geq$T (floating gate electrode)) since the difference $h_1$ between the heights of the silicon nitride films 14 formed on the peripheral circuit region and the memory cell region respectively results from the thickness of the first gate electrode 4 and the thickness T (silicon nitride film) must be at least in excess of this thickness in order to reduce the difference $h_1$.

On the other hand, the sum of the thicknesses T (WSi layer), T (polysilicon layer) and T (floating gate electrode) is set greater than or equal to the thickness T (silicon nitride film) (T (WSi layer)+T (polysilicon layer)+T (floating gate electrode)$\geq$T (silicon nitride film) ) since stress is applied to the tunnel oxide film 3 to deteriorate semiconductor characteristics if the thickness (T (silicon nitride film)) of the silicon nitride film 14 exceeds the sum of the thicknesses T (WSi layer), T (polysilicon layer) and T (floating gate electrode) due to the difference between the thermal expansion coefficients of these materials.

Assuming that the thickness T (floating gate electrode) of the first gate electrode 4 is about 1000 Å, the thickness T (polysilicon layer) of the polysilicon layers 7 is about 1500 Å and the thickness T (WSi layer) of the WSi layers 8 is about 1500 Å, for example, the thickness T (silicon nitride film) of the silicon nitride film 14 is preferably selected in the range of 2500 Å to 3500 Å. Further, the aforementioned conditions are preferably selected when occupancy of a gate pattern exceeds 40% in the chip.

This is because scraping of nitride films in CMP can be rendered readily detectable due to presence of at least a specific number of nitride films corresponding to the gate pattern in the chip as described later.

Figure 8:
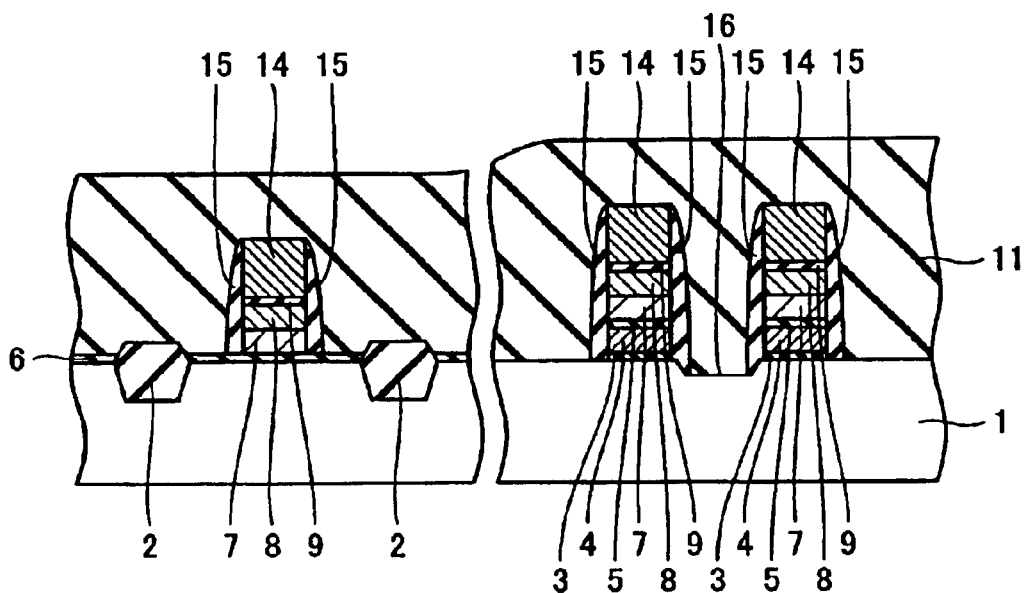

Referring to FIG. 8, side wall spacers 15 are formed on side walls of the control gate electrode of a peripheral transistor and those of memory cells. Thereafter a source line 16 is formed by etching. A first interlayer dielectric film 11 of $SiO_2$ is formed on the silicon substrate 1 to cover the peripheral transistor and the memory cells.

Figure 9:
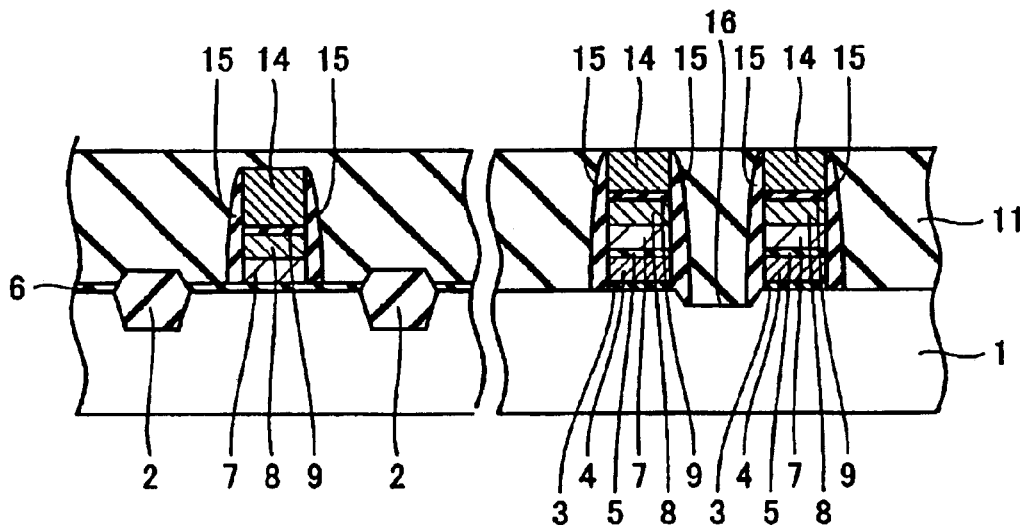

Referring to FIGS. 8 and 9, the first interlayer dielectric film 11 is subjected to chemical mechanical polishing. This CMP processing is completed when detecting exposure of the surfaces of the silicon nitride films 14. This exposure of the surfaces of the silicon nitride films 14 is determined by detecting a component generated from the silicon nitride films 14. In order to render this component detectable, the surfaces of the silicon nitride films 14 are preferably scraped by 50 Å to 150 Å. Thus, the difference $h_2$ between the heights of the silicon nitride films 14 is further reduced.

Thus, the surface of the first interlayer dielectric film 11 is flattened due to the CMP.

Figure 10:
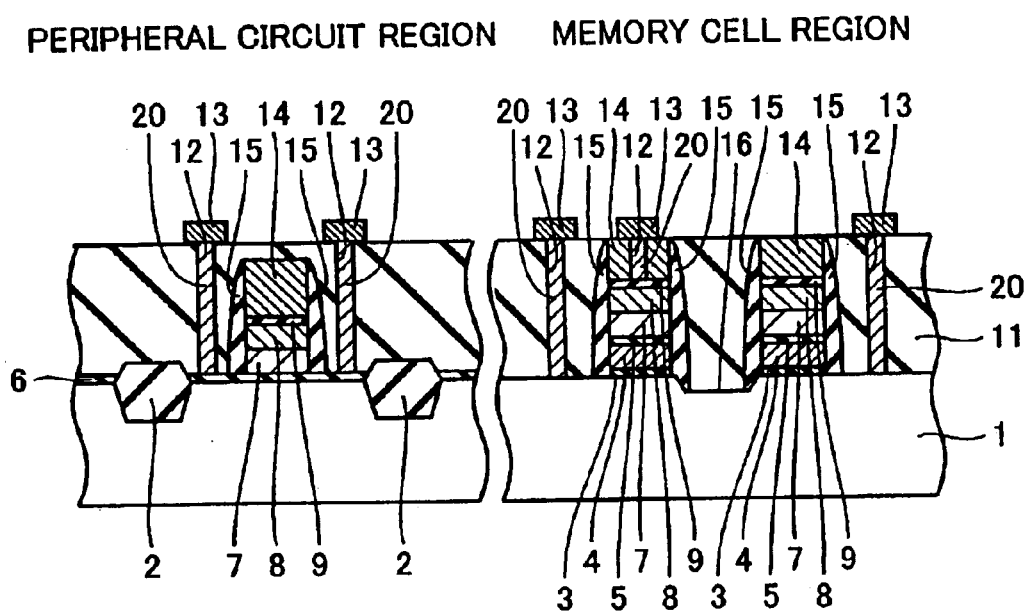

Referring to FIG. 10, contact holes 12 are formed in the interlayer dielectric film 11 and W is embedded in the contact holes 12 for forming plugs 20. First metal wires 13 are formed on the plugs 20 by Al.

Figure 11:
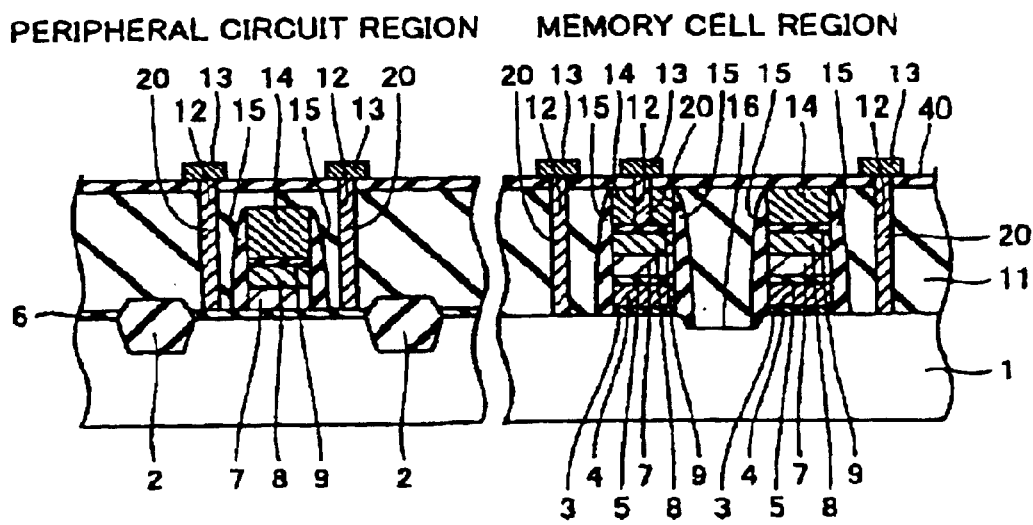
FIG. 11 is a sectional view showing a modification of the method of fabricating the semiconductor device according to the first embodiment of the present invention.

While the contact holes 12 are formed after CMP in the step shown in FIG. 10, the present invention is not restricted to this but another interlayer dielectric film 40 such as a silicon oxide film may be formed before formation of contact holes 12, as shown in FIG. 11. In this case, silicon nitride films 14 are not directly in contact with first metal wires 13, to be hardly subjected to stress. The thickness of the silicon nitride films 14 formed on a memory cell region is smaller than that of the silicon nitride film 14 formed on a peripheral circuit region due to scraping and deposition in CMP. In FIG. 11, further, the thickness of the interlayer dielectric film 40 can be reduced in the memory cell region. Referring to FIG. 11, parts identical to those shown in FIG. 10 are denoted by the same reference numerals, and redundant description is not repeated.

Thus, a flash memory provided with the interlayer dielectric film 50 having a flat surface is completed.

Second Embodiment

Figure 12:
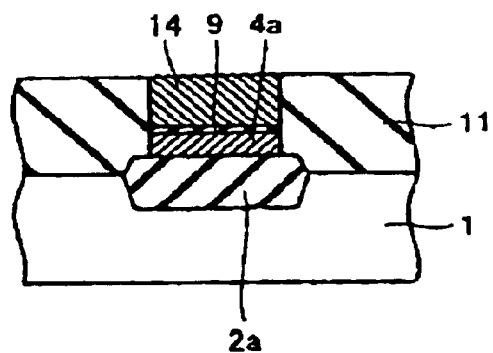
FIG. 12 is a sectional view showing a portion between a peripheral transistor and a memory cell of a semiconductor device according to a second embodiment of the present invention.

FIG. 12 is a sectional view of a dummy shallow trench isolation (STI) film 2a and a dummy gate electrode 4a formed between a peripheral transistor and a memory cell in steps, similar to those shown in FIGS. 5 and 6, of fabricating a semiconductor device according to a second embodiment of the present invention. When such dummy shallow trench isolation (STI) films 2a and dummy first gate electrodes 4a are partially introduced, the surface of a first interlayer dielectric film 11 is further flattened. A silicon nitride film 14 is formed on the dummy first gate electrode 4a through a TEOS film 9. The dummy gate electrode 4a is a gate pattern not directly related to circuit operation.

Dummy patterns are particularly preferably provided when occupancy of a general gate electrode pattern is less than 40% in the chip, in order to simplify scraping of the silicon nitride film 14 in CMP.

Figure 13:
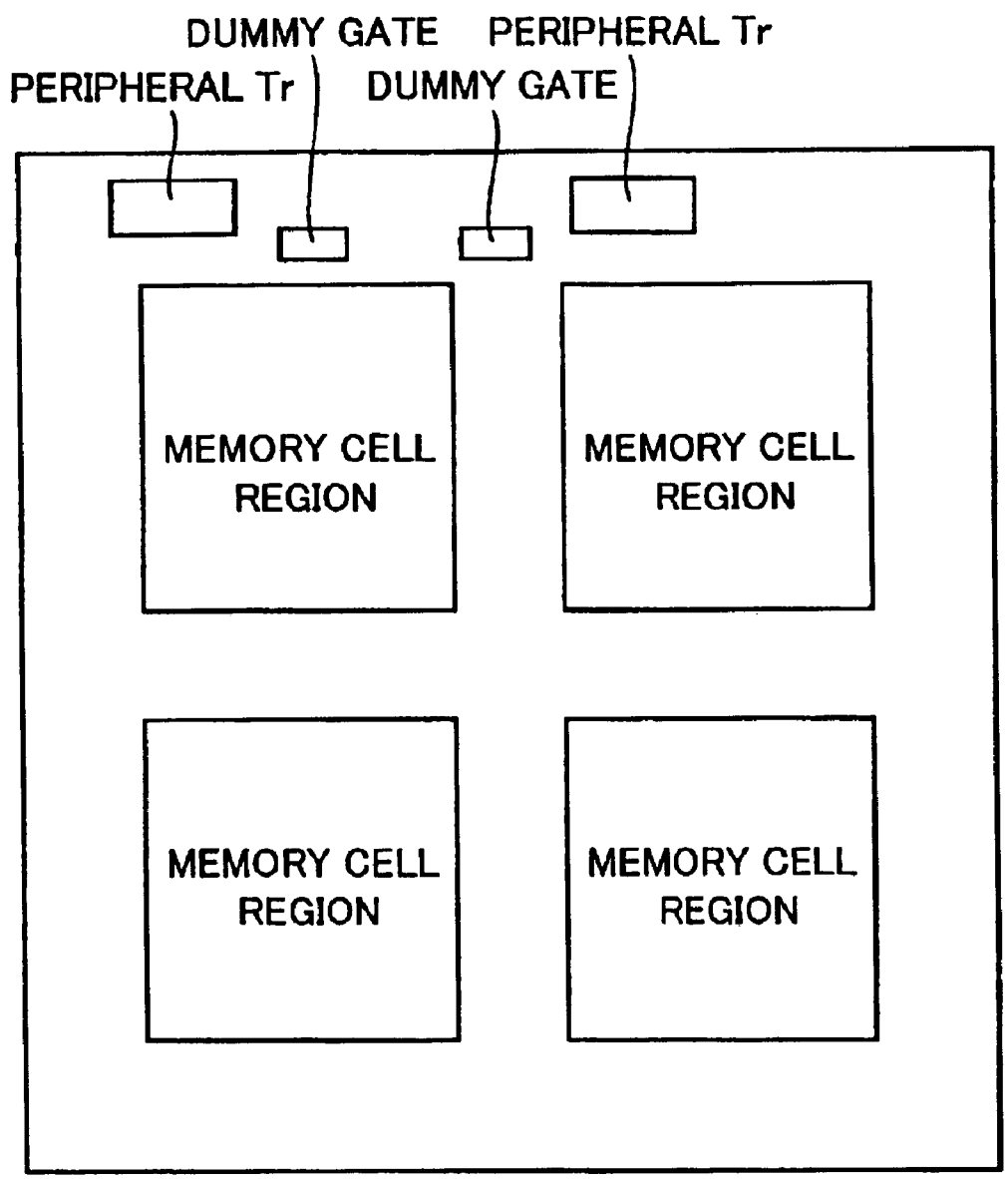
FIG. 13 is a plan view of a conventional flash memory.
Figure 14:
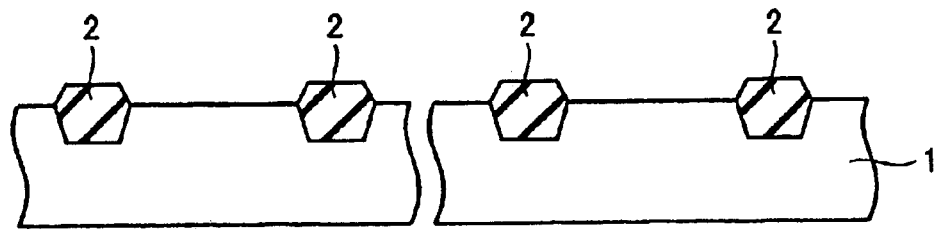
FIGS. 14 to 18 are sectional views showing first to fifth steps of a method of fabricating a conventional semiconductor device.
Figure 15:
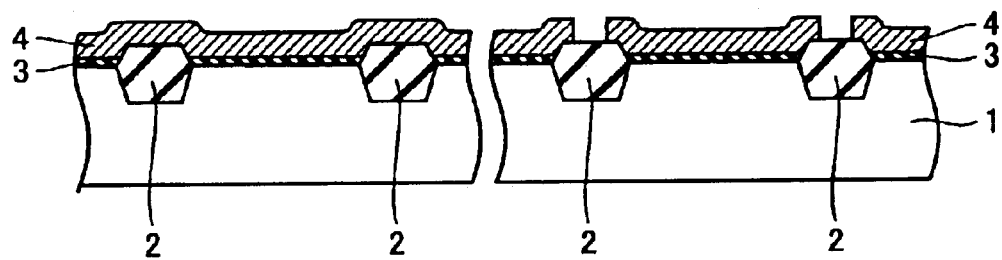
Figure 16:
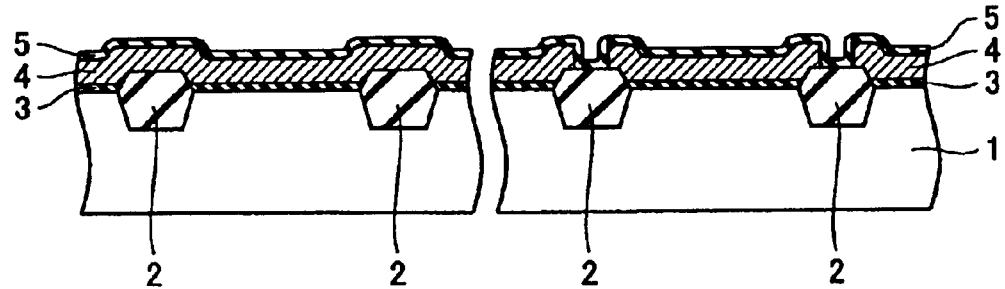
Figure 17:
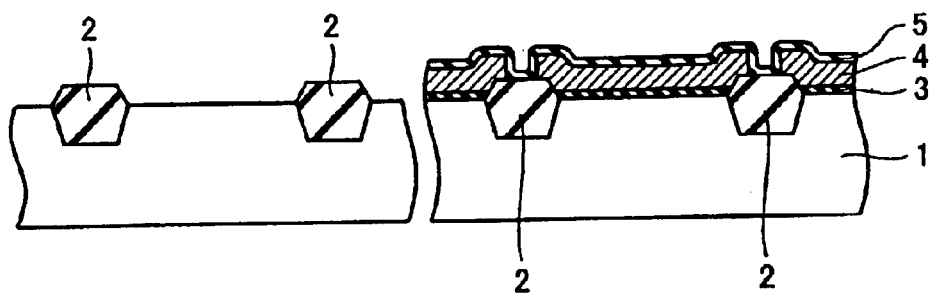
Figure 18:
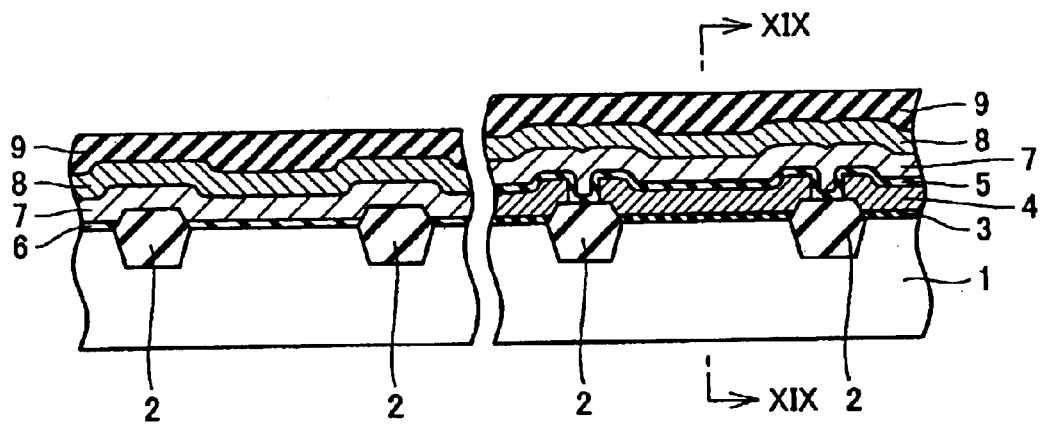
Figure 19:
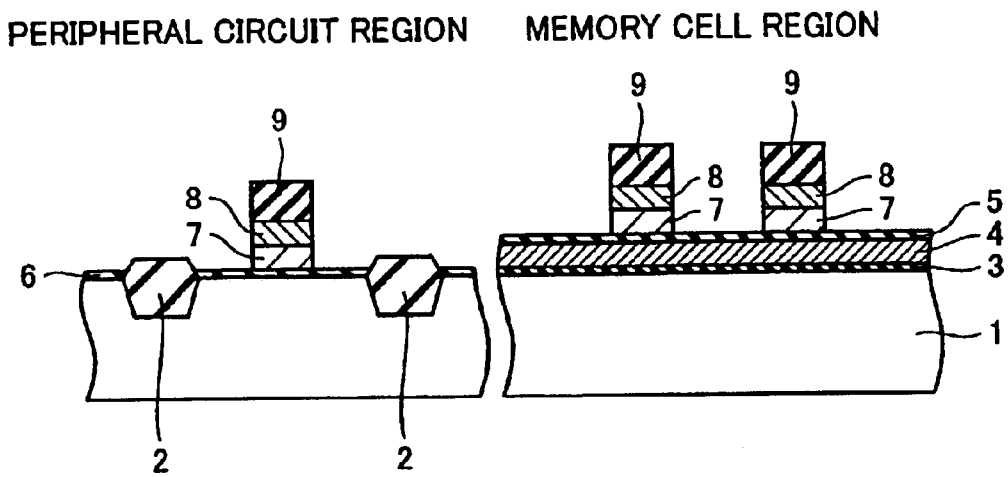
FIG. 19 is a sectional view of the conventional semiconductor device taken along the line XIX—XIX in FIG. 18.
Figure 20:
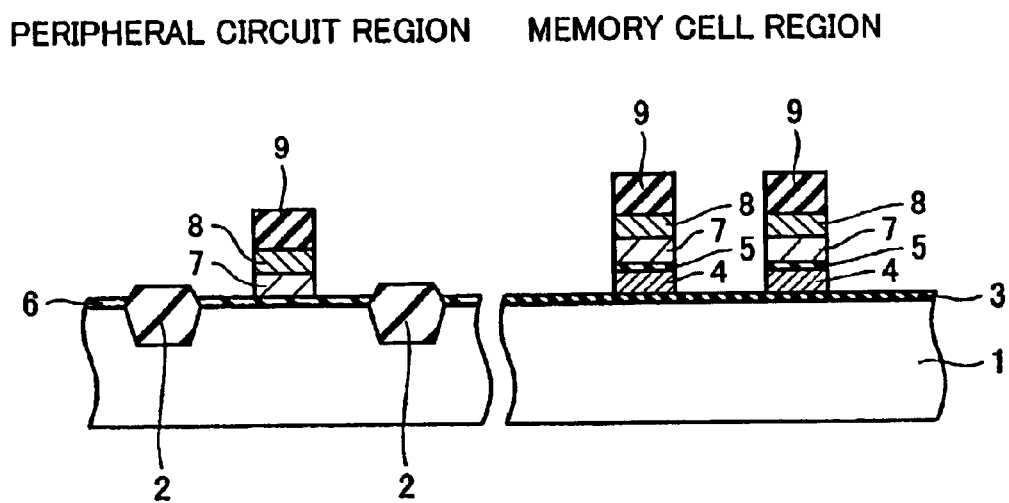
FIGS. 20 to 23 are sectional views showing sixth to ninth steps of the method of fabricating the conventional semiconductor device.
Figure 21:
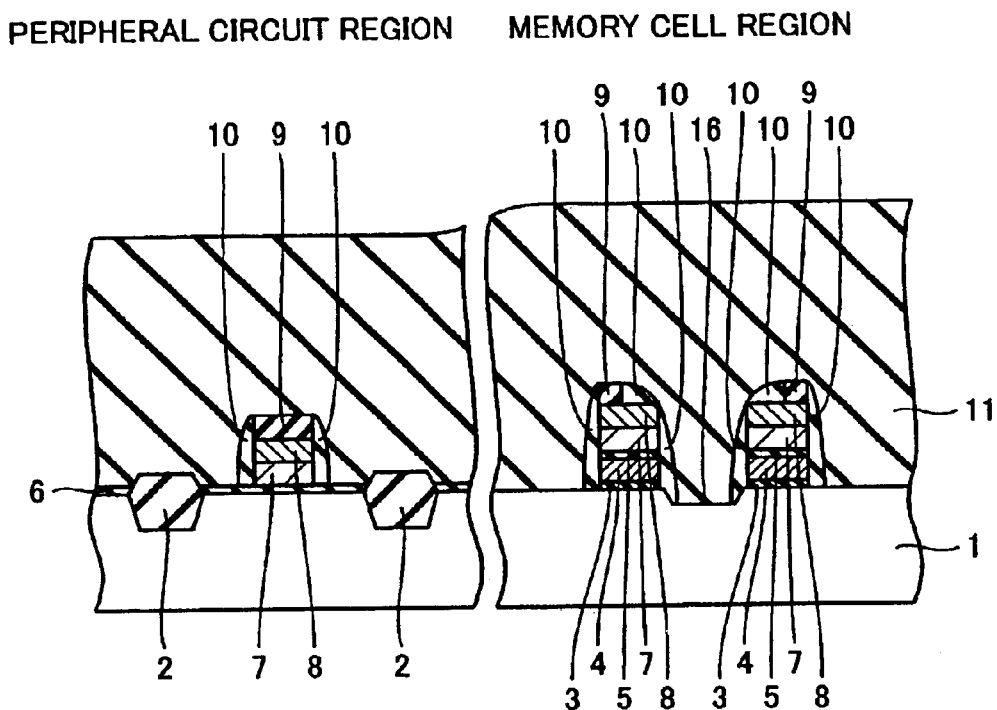
Figure 22:
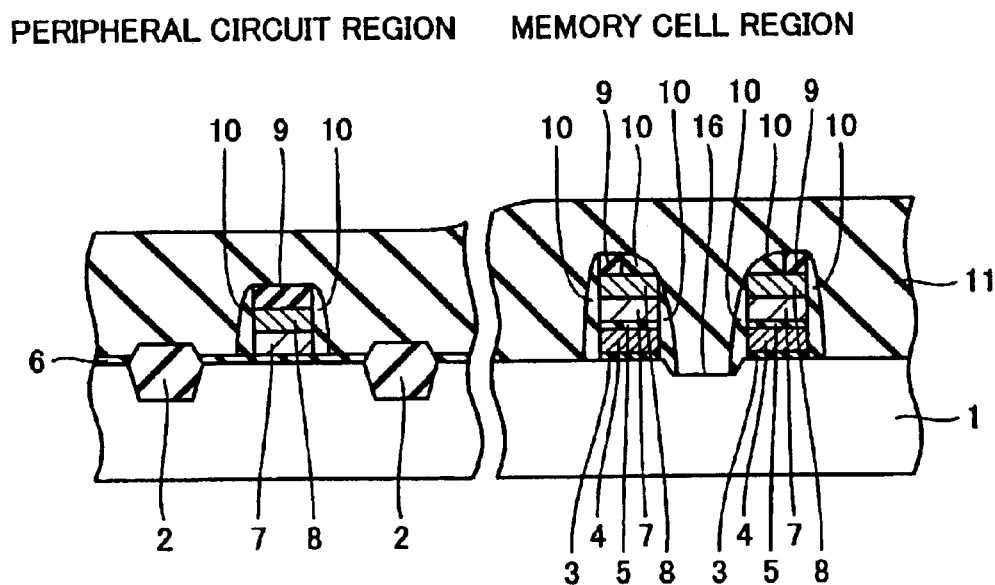
Figure 23:
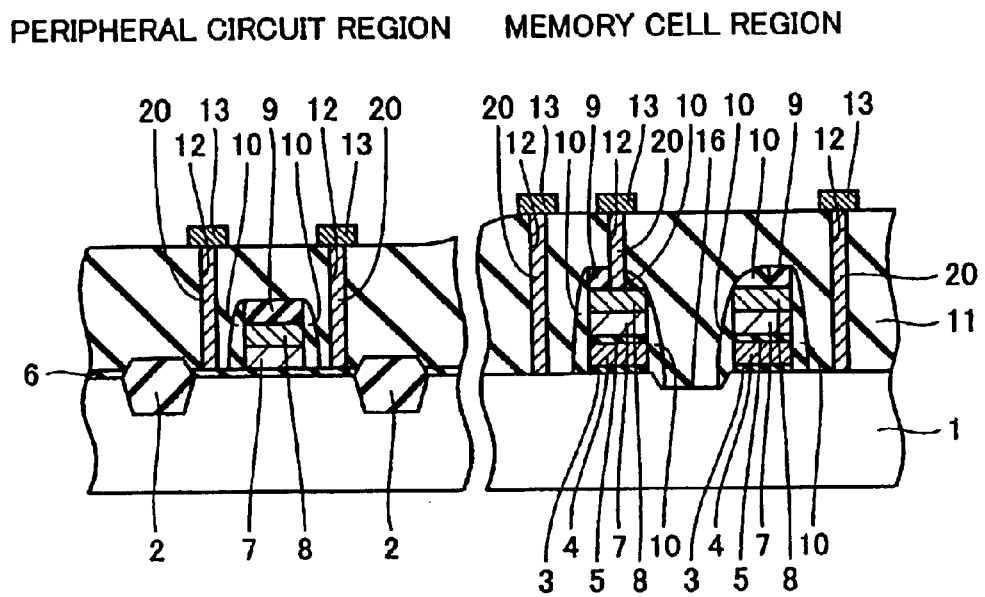
Figure 24:
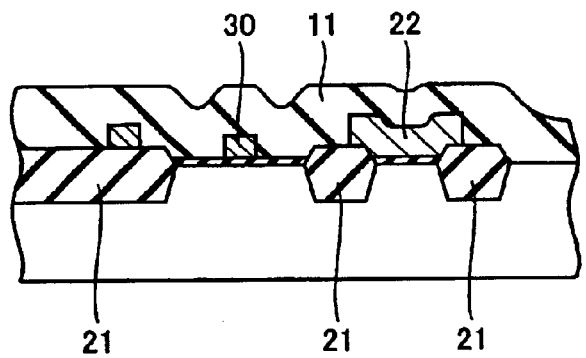
FIG. 24 is a sectional view showing a portion of a conventional transistor around a gate electrode and a dummy gate electrode.
Figure 25:
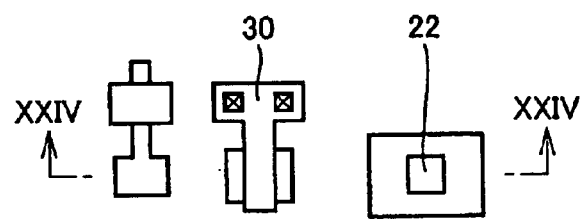
FIG. 25 is a plan view of the potion shown in FIG. 24.

While each of the aforementioned embodiments illustrates a control gate electrode of a flash memory as a gate electrode, the present invention is not restricted to this. In any case, the present invention is applicable to a semiconductor device having a gate electrode provided on an active region. Particularly when at least a specific number of patterns are employed for a memory cell array, scraping in CMP can be detected. While FIG. 13 shows a memory chip, for example, a memory cell array preferably occupies the most part (about 40%) of the chip. The present invention is also applicable to a gate electrode of an SRAM (Static Random Access Memory) or a memory transistor. The present invention is further applicable to a DRAM (Dynamic Random Access Memory) having a storage node corresponding to the aforementioned gate electrode.

While silicon nitride films are employed as exemplary nitride films in each of the aforementioned embodiments, the present invention is not restricted to this but the nitride films may be those scrapable and detectable by CMP. For example, an effect similar to the above can be attained through silicon oxynitride films under smaller stress than silicon nitride films. While it has been described that the silicon nitride films tend to be deposited for improving flatness, the films can be regarded as superior in view of excellent detection sensitivity in CMP even if flatness is not improved, depending on the pattern or film forming conditions.

While shallow trench isolation films are employed as exemplary isolation films in each of the aforementioned embodiments, the present invention is not restricted to this but an effect similar to the above can be attained also through filed oxide films formed by a LOCOS (Local Oxidation of Silicon) method.

In the semiconductor device according to the present invention, as hereinabove described, the thickness of the second pattern provided on the first pattern is smaller than that of the fourth pattern although the height of the third pattern between the main surface of the semiconductor substrate and the surface of the pattern is lower than the first pattern while the thickness of the interlayer dielectric film is also small, whereby the step of the wire is improved between the memory cell region and the peripheral circuit region so that the second conductive layer is improved in flatness and reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell region having a memory cell and a peripheral circuit region having a transistor, both provided on a semiconductor substrate;
   a first pattern consisting of a first conductive layer forming said memory cell;
   a second pattern consisting of a film of silicon nitride provided on said first pattern in correspondence to said first pattern;
   a third pattern forming a gate electrode of said transistor so that the height between the main surface of said semiconductor substrate and the surface of said third pattern is lower than said first pattern;
   a fourth pattern consisting of a film of silicon nitride provided on said gate electrode in correspondence to said third pattern with a larger thickness than said second pattern;
   a second conductive layer formed on said second and fourth patterns; and
   an interlayer dielectric film so formed that a portion located between said second pattern and said second conductive layer has a thickness smaller than a thickness of a portion located between said fourth pattern and said second conductive layer.

2. The semiconductor device according to claim 1, wherein occupancy of said first pattern is at least 40% in a chip.

3. A semiconductor device comprising:
   a memory cell region having a memory cell and a peripheral circuit region having a transistor, both provided on a semiconductor substrate;

a first pattern consisting of a first conductive layer forming said memory cell;

a second pattern consisting of a film, containing nitrogen atoms, provided on said first pattern in correspondence to said first pattern;

a third pattern forming a gate electrode of said transistor so that the height between the main surface of said semiconductor substrate and the surface of said third pattern is lower than said first pattern;

a fourth pattern consisting of a film, containing nitrogen atoms, provided on said gate electrode in correspondence to said third pattern with a larger thickness than said second pattern;

a second conductive layer formed on said second and fourth patterns; and an interlayer dielectric film so formed that a portion located between said second pattern and said second conductive layer has a thickness smaller than a thickness of a portion located between said fourth pattern and said second conductive layer, wherein said first pattern is a control gate electrode, said semiconductor device further comprising a floating gate electrode provided between said first pattern and said semiconductor substrate, for satisfying the following inequality assuming that T (fourth pattern) represents the thickness of said fourth pattern and T (floating gate electrode) represents the thickness of said floating gate electrode: T (fourth pattern)≧T (floating gate electrode).

4. The semiconductor device according to claim 3, further satisfying the following condition assuming that T (first pattern) represents the thickness of said first pattern:

$$T \text{ (first pattern)} + T \text{ (floating gate electrode)} \geq T \text{ (fourth pattern)}.$$

5. A semiconductor device comprising:

a memory cell region having a memory cell and a peripheral circuit region having a transistor, both provided on a semiconductor substrate;

a first pattern consisting of a first conductive layer forming said memory cell;

a second pattern consisting of a film, containing nitrogen atoms, provided on said first pattern in correspondence to said first pattern;

a third pattern forming a gate electrode of said transistor so that the height between the main surface of said semiconductor substrate and the surface of said third pattern is lower than said first pattern;

a fourth pattern consisting of a film, containing nitrogen atoms, provided on said gate electrode in correspondence to said third pattern with a larger thickness than said second pattern;

a second conductive layer formed on said second and fourth patterns;

an interlayer dielectric film so formed that a portion located between said second pattern and said second conductive layer has a thickness smaller than a thickness of a portion located between said fourth pattern and said second conductive layer;

a dummy isolation film provided between said transistor of said peripheral circuit region and said memory cell, a dummy gate electrode provided on said dummy isolation film, and a film, containing nitrogen atoms, provided on said dummy gate electrode through an insulator film.

6. A semiconductor device comprising:

a memory cell region having a memory cell and a peripheral circuit region having a transistor, both provided on a semiconductor substrate;

a first pattern consisting of a first conductive layer forming said memory cell;

a second pattern consisting of a film, containing nitrogen atoms, provided on said first pattern in correspondence to said first pattern;

a third pattern forming a gate electrode of said transistor so that the height between the main surface of said semiconductor substrate and the surface of said third pattern is lower than said first pattern;

a fourth pattern consisting of a film, containing nitrogen atoms, provided on said gate electrode in correspondence to said third pattern with a larger thickness than said second pattern;

a second conductive layer formed on said second and fourth patterns; and an interlayer dielectric film so formed that a portion located between said second pattern and said second conductive layer has a thickness smaller than a thickness of a portion located between said fourth pattern and said second conductive layer, wherein said first pattern is a control gate electrode, a floating gate electrode is provided between said first pattern and said semiconductor substrate, an insulator film is provided between said control gate electrode and said floating gate electrode, and said second pattern and said insulator film are made of materials exhibiting etching rates substantially identical to each other.

7. The semiconductor device according to claim 6, wherein said second pattern is formed by a silicon nitride film and said insulator film is formed by an oxide film, a nitride film and an oxide film.

* * * * *